(12) United States Patent
Scudder et al.

(10) Patent No.: US 8,937,005 B2
(45) Date of Patent: Jan. 20, 2015

(54) REDUCING OR ELIMINATING PRE-AMORPHIZATION IN TRANSISTOR MANUFACTURE

(71) Applicant: SuVolta, Inc., Los Gatos, CA (US)

(72) Inventors: Lance S. Scudder, Sunnyvale, CA (US);
Pushkar Ranade, Los Gatos, CA (US);
Charles Stager, Austin, TX (US);
Urupattur C. Sridharan, San Jose, CA (US); Dalong Zhao, San Jose, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 14/046,147

(22) Filed: Oct. 4, 2013

(65) Prior Publication Data

US 2014/0038386 A1     Feb. 6, 2014

Related U.S. Application Data

(63) Continuation of application No. 13/473,403, filed on May 16, 2012, now Pat. No. 8,569,156.

(60) Provisional application No. 61/486,494, filed on May 16, 2011.

(51) Int. Cl.
*H01L 21/425* (2006.01)
*H01L 21/336* (2006.01)
(Continued)

(52) U.S. Cl.
CPC ........ *H01L 21/046* (2013.01); *H01L 21/26506* (2013.01); *H01L 29/6659* (2013.01);
(Continued)

(58) Field of Classification Search
CPC ............... H01L 21/046; H01L 29/105; H01L 29/66068

USPC .................. 438/527, 308, 530, 481
See application file for complete search history.

(56) References Cited

U.S. PATENT DOCUMENTS

| 3,958,266 A | 5/1976 | Athanas |
| 4,000,504 A | 12/1976 | Berger |

(Continued)

FOREIGN PATENT DOCUMENTS

| EP | 0274278 | 7/1988 |
| EP | 0312237 | 4/1989 |

(Continued)

OTHER PUBLICATIONS

Banerjee, et al. "Compensating Non-Optical EffectsUS CON1 ing Electrically-Driven Optical Proximity Correction", Proc. of SPIE vol. 7275 7275OE, 2009.

(Continued)

*Primary Examiner* — Luan C Thai
(74) *Attorney, Agent, or Firm* — Baker Botts L.L.P.

(57) ABSTRACT

A method for fabricating field effect transistors using carbon doped silicon layers to substantially reduce the diffusion of a doped screen layer formed below a substantially undoped channel layer includes forming an in-situ epitaxial carbon doped silicon substrate that is doped to form the screen layer in the carbon doped silicon substrate and forming the substantially undoped silicon layer above the carbon doped silicon substrate. The method may include implanting carbon below the screen layer and forming a thin layer of in-situ epitaxial carbon doped silicon above the screen layer. The screen layer may be formed either in a silicon substrate layer or the carbon doped silicon substrate.

20 Claims, 11 Drawing Sheets

(51) Int. Cl.
*H01L 21/36* (2006.01)
*H01L 21/20* (2006.01)
*H01L 21/04* (2006.01)
*H01L 21/265* (2006.01)
*H01L 29/66* (2006.01)
*H01L 29/10* (2006.01)
*H01L 21/82* (2006.01)
*H01L 29/78* (2006.01)

(52) U.S. Cl.
CPC ......... *H01L29/105* (2013.01); *H01L 29/1083* (2013.01); *H01L 21/8213* (2013.01); *H01L 29/66068* (2013.01); *H01L 29/66651* (2013.01); *H01L 29/7833* (2013.01)
USPC ............ 438/527; 438/308; 438/530; 438/481

(56) References Cited

U.S. PATENT DOCUMENTS

| | | |
|---|---|---|
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A | 6/1995 | Yilmaz et al. |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A | 11/1999 | Seliskar |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |

(56) References Cited

U.S. PATENT DOCUMENTS

| | | |
|---|---|---|
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara et al. |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jaehne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,345,270 B1 | 3/2008 | Jones et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |

(56) References Cited

U.S. PATENT DOCUMENTS

| | | | |
|---|---|---|---|
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,750,174 B2 | 7/2010 | Snow et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,273,617 B2 | 9/2012 | Thompson et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0131665 A1* | 6/2006 | Murthy et al. ............... 257/384 |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |

(56) References Cited

U.S. PATENT DOCUMENTS

| | | |
|---|---|---|
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Cheng, et al. "Extremely Thin SOI (ETSOI) CMOS with Record Low Variability for Low Power System-on-Chip Applications". Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 µm CMOS with a Step Channel Profile Formed by Ultra High Vacuum CVD and In-Situ Doped Ions", Proceedsing of the International Electron Devices Meeting, New York, IEEE,US CON1, pp. 909-911, Dec. 5, 1993.

Matsuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudinm K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

Ohguro, T et al., "An 0.18-µm CMOS for Mixed Digital and Analog Applications with Zero-Volt-Vth Epitaxial-Channel MOSFETs", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res Soc. Symp. vol. 610, 2000.

Scholz, R et al., "Carbon-Induced Undersaturation of Silicon Self-Interstitials", Appl. Phys. Lett 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Sealing: Transistor Challenges for the 21st Century", Intel Technology Journal Q3' 1998, pp. 1-19.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Sealing the Si MOSFET: From Bulk to SOI to Bulk", IEEE Transactions on Electron Devices, vol. 39, No. 7, Jul. 1992.

Abiko, H et al., "A Channel Engineering Combined with Channel Epitaxy Optimization and TED Suppression for 0.15 µm n-n Gate CMOS Technology", 1995 Symposium on VLSI Technology Digest of Technical Papers, pp.23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-x}C_x$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U at al., Diffusion Engineering by Carbon in Silicon, Mat. Res. Soc. Symp. vol. 610, 2000.

(56) References Cited

OTHER PUBLICATIONS

Hokazono, A et al., "Steep Channel & Halo Profiled Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Levéant, P. "Incorporation, Diffusion and Agglomeration of Carbon in Silicon", Solid State Phenomena, vols. 82-84, pp. 189-194, 2002.

Noda, K at al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.

Scholz, R et al., "Carbon-Induced Undersaturation of Silicon Self-Interstitials", Appl. Phys. Lett. 72(2), pp. 200-202, Jan. 1998.

* cited by examiner

REDUCING OR ELIMINATING PRE-AMORPHIZATION IN TRANSISTOR MANUFACTURE

CROSS-REFERENCE TO RELATED APPLICATIONS

This application is a continuation of U.S. application Ser. No. 13/473,403 filed May 16, 2012, which claims the benefit of U.S. Provisional Application No. 61/486,494 filed May 16, 2011, each being hereby incorporated by reference herein.

TECHNICAL FIELD

Integrated circuit processes and structures to allow for improved semiconductor substrate treatment are disclosed.

BACKGROUND

Placement of dopants in MOSFET transistors is increasingly difficult as transistor size is reduced. Misplaced dopants can reduce transistor performance and increase transistor variability, including variability of channel transconductance, capacitance effects, threshold voltage, and leakage. Such variability increases as transistors are reduced in size with each misplaced dopant atom having a greater relative effect on transistor properties consequent to the overall reduction in number of dopant atoms. One common source of misplaced dopants occurs as a result of damage to crystal structure of a transistor during manufacture, which increases defect pathways and creates excess silicon interstitials that allow enhanced dopant movement in undesired regions of the transistor.

A pre-amorphizing implant (PAI) can be used in semiconductor processing as a way to set up for dopant substitutionality. A PAI process generally involves introducing a dopant species using a high energy ion implantation to impart damage and thereby amorphize the implanted region. The damage and amorphization are important so that dopants from a previous or subsequent ion implantation can more easily move into substitutional sites. If PAI is used, then a subsequent anneal is performed to render the substrate crystalline again.

However, with the typical anneal process that is used, which is either a solid phase epitaxy (SPE) or high temperature anneal such as RTA, there remains residual damage from PAI which can create a pathway for leakage current by acting as localized generation/recombination sites.

BRIEF DESCRIPTION OF THE FIGURES

For a more complete understanding of the present disclosure, reference is made to the following description taken in conjunction with the accompanying drawings, wherein like reference numerals represent like parts, in which.

DETAILED DESCRIPTION

Unwanted transient enhanced diffusion (TED) resulting from defects and injected silicon interstitials from defect clusters can easily reduce or destroy transistor functionality, particularly for nanometer scale transistors having complex dopant profiles such as disclosed, for example, in embodiments of various transistor structures and manufacturing processes more completely described in U.S. application Ser. No. 12/708,497 titled "Electronic Devices and Systems, and Methods for Making and Using the Same", U.S. application Ser. No. 12/971,884 titled "Low Power Semiconductor Transistor Structure and Method of Fabrication Thereof", U.S. application Ser. No. 12/971,955 titled "Transistor with Threshold Voltage Set Notch and Method of Fabrication Thereof", and U.S. application Ser. No. 12/895,785 titled "Advanced Transistors With Threshold Voltage Set Dopant Structures", the disclosures of which are hereby incorporated herein by reference in their entirety.

Figure 1:
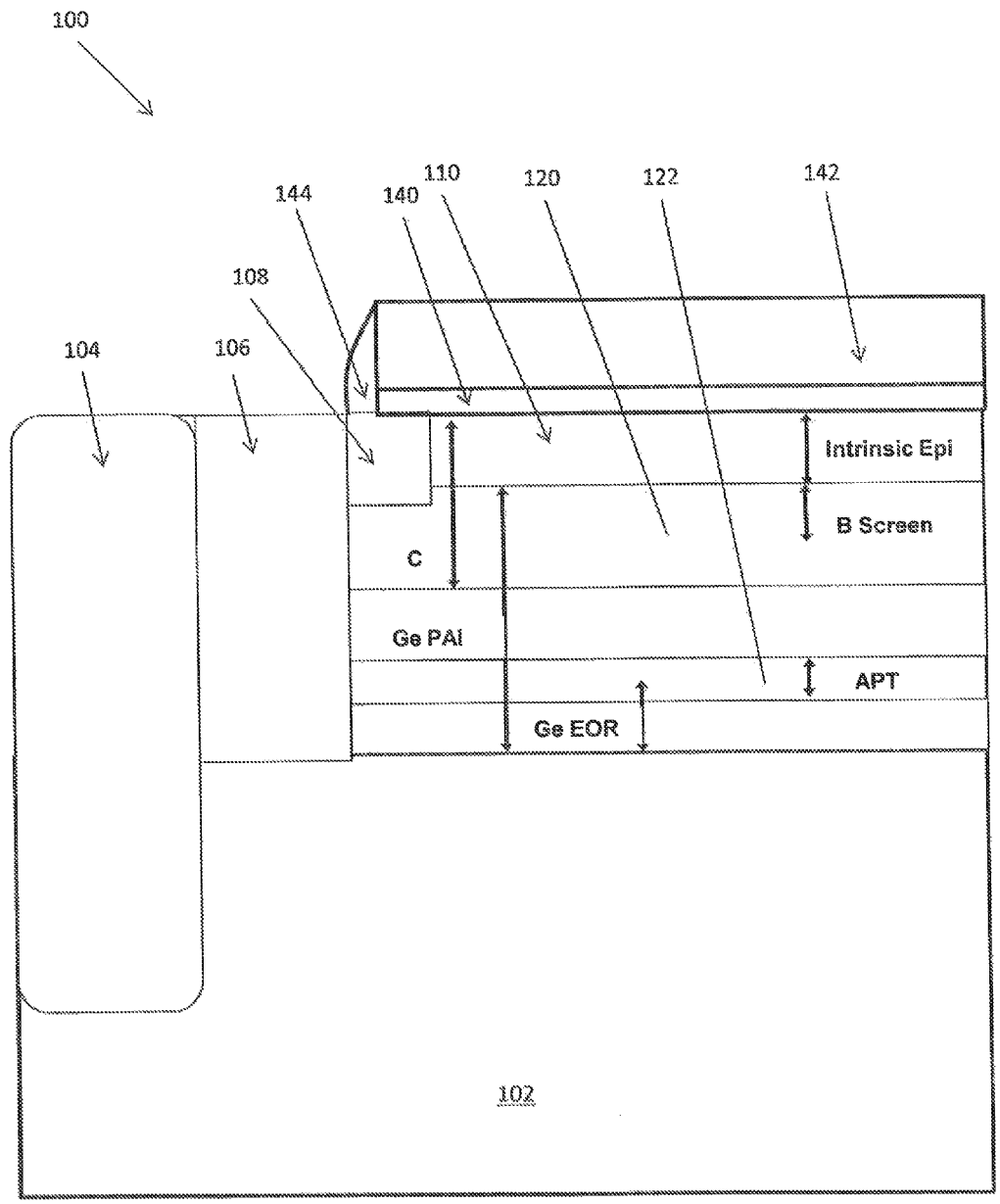
FIG. 1 illustrates an embodiment of an NMOS transistor incorporating germanium pre-amorphization implants and a screen layer.
Figure 2:
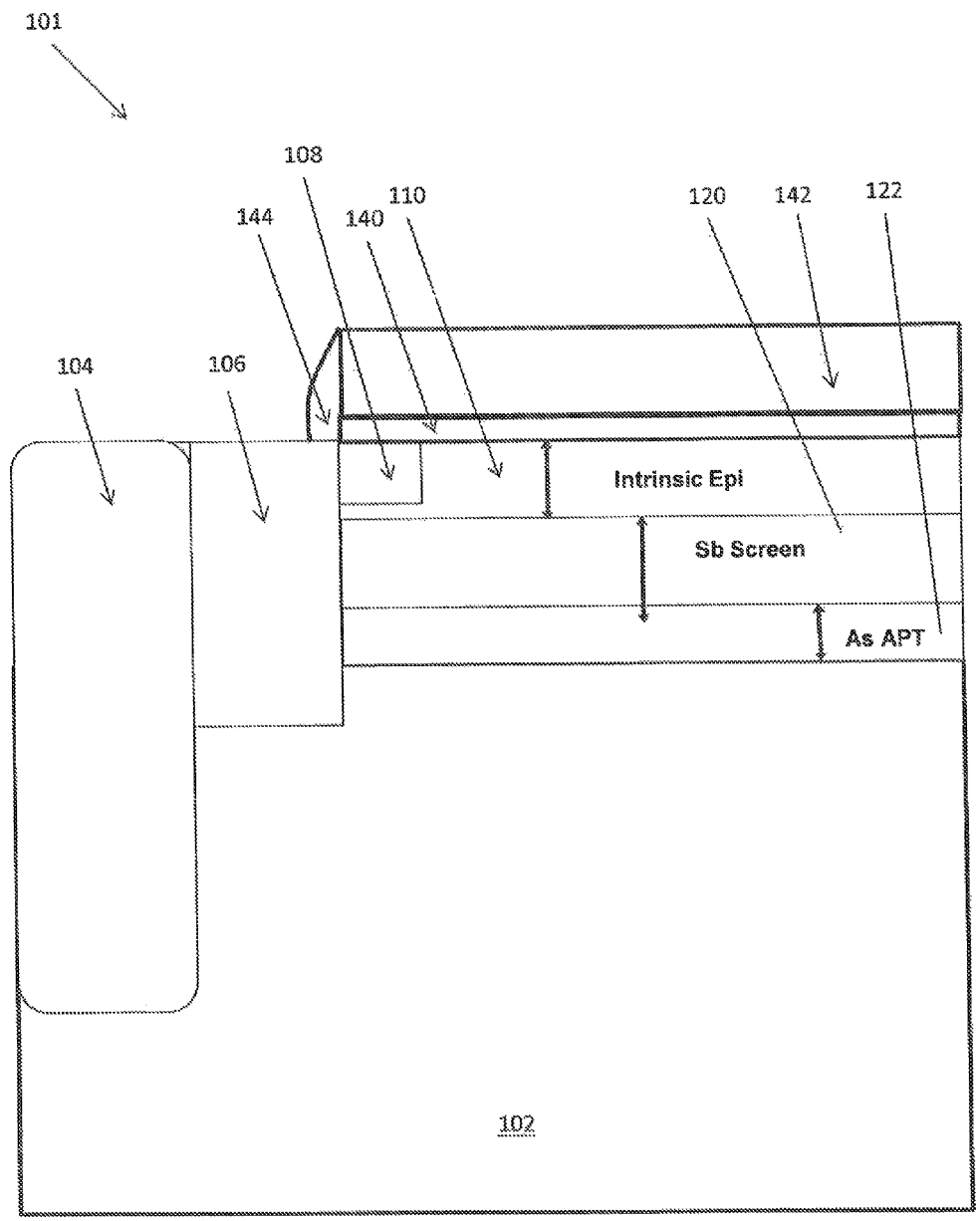
FIG. 2 illustrates an embodiment of a PMOS transistor incorporating a screen layer and formable along with a structure according to FIG. 1.

As shown in FIGS. 1 and 2, a transistor 100 is built on a substrate 102 and includes an isolation structure 104, a gate electrode 142, a gate dielectric 140, source/drain 106, a gate spacer 144 separating the source/drain 106 from the gate electrode 142, lightly doped drains (LDD) 108, and a substantially undoped silicon channel layer 110 that can be epitaxially grown/deposited. Typically, the LDD 108 are implanted following the formation of the gate stack, followed by gate spacer 144 formation and then implant or, alternatively, selective epitaxial deposition of deep source/drain regions 106. The transistor 100 shown in FIG. 1 is an NMOS deeply depleted channel (DDC) transistor, while FIG. 2 illustrates a complementary PMOS DDC transistor 101 supported on the same substrate. Each transistor 100 and 101 has a substantially undoped channel formed in a common blanket epitaxial layer 110, but differing in dopant types and implant energies. With suitable changes to account for differences in dopants, structures and processes for the NMOS and PMOS transistors 100 and 101 are similar and are discussed together in the following where appropriate.

With reference to FIG. 1, the NMOS transistor 100 includes a screen layer 120. In certain embodiments, the screen layer 120 is formed by implanting dopants into a P-well (not shown) formed on the substrate 102. In alternative embodiments, the screen layer 120 is formed on the P-well using methods such as in-situ doped epitaxial silicon deposition or epitaxial silicon deposition followed by dopant implantation. The screen layer 120 formation step occurs preferably before shallow trench isolation (STI) formation, but can be implemented after STI. Boron (B), Indium (I), or other P-type materials may be used for P-type screen implants (as shown with reference to the screen layer 120 in FIG. 1). Arsenic (As), antimony (Sb), phosphorous (P), and other N-type materials can be used for N-type screen implants (as shown with reference to the screen layer 120 in FIG. 2). In certain embodiments, the screen layer 120 has a dopant concentration between about $1\times10^{19}$ to $5\times10^{20}$ dopant atoms/cm$^3$, with the selected dopant concentration dependent on the desired threshold voltage as well as other desired transistor characteristics.

As shown in FIG. 1, an anti-punchthrough (APT) suppression layer 122 may optionally be formed beneath the screen layer 120. The APT suppression layer 122 can help reduce junction leakage. The APT suppression layer 122 can be separated from the screen layer 120 (e.g., the screen layer 120 as shown in FIG. 1) or it may contact the screen layer 120 (e.g., the screen layer 120 as shown in FIG. 2). Typically, the APT suppression layer 122 can be formed by direct implant into a lightly doped well, by out-diffusion from the screening layer 120, in-situ growth, or other known process. The APT suppression layer 122 has a dopant concentration less than the screening layer 120, typically set between about $1\times10^{17}$ dopant atoms per cm$^3$ and about $1\times10^{19}$ dopant atoms per cm$^3$. In addition, the APT suppression layer 122 dopant concentration is set higher than the overall dopant concentration of the substrate 102 or the well in which the transistor is formed.

In certain embodiments, an optional threshold voltage set layer is formed above the screen layer 120, typically formed as a thin doped layer. The threshold voltage set layer can be either adjacent to, incorporated within, or vertically offset from the screen layer 120. In certain embodiments, the threshold voltage set layer is formed by implantation prior to the formation of the undoped epitaxial layer 110. In alternative embodiments, the threshold voltage set layer can be formed by way of controlled out-diffusion of dopant material from the screen layer 120 into an undoped epitaxial layer, controlled in-situ doped epitaxial deposition either as part of screen layer 120 formation or separate from the formation of the screen layer 120, controlled formation before the substantially undoped epitaxial layer 110 is formed, or by implant after the substantially undoped epitaxial layer 110 is formed. Setting of the threshold voltage for the transistor is implemented by suitably selecting dopant concentration and depth of the threshold voltage set layer as well as maintaining a separation of the threshold voltage set layer from the gate dielectric 140, leaving a substantially undoped channel layer 110 directly adjacent to the gate dielectric. In certain embodiments, the threshold voltage set layer has a dopant concentration between about $1\times10^{17}$ dopant atoms/cm$^3$ and about $1\times10^{19}$ dopant atoms per cm$^3$. In alternative embodiments, the threshold voltage set layer has a dopant concentration that is approximately less than half of the concentration of dopants in the screen layer 120.

The channel layer 110 contacts and extends between the source/drain 106 and supports movement of mobile charge carriers between the source and the drain. In certain embodiments, the channel layer 110 is formed above the screen layer 120 and threshold voltage set layer (the screen layer 120, threshold voltage set layer, and APT suppression layer 122 are also referred to as well implant layers) by way of a blanket or selective silicon EPI deposition, resulting in an intrinsic substantially undoped channel layer 110 of a thickness tailored to the technical specifications of the device. As a general matter, the thickness of the substantially undoped channel layer 110 ranges from approximately 5-30 nm, with the selected thickness based upon the desired threshold voltage and other transistor performance metrics for the transistor and transistor design node (i.e. a 20 nm gate length transistor may typically have a thinner channel thickness than a 45 nm gate length transistor). Preferably, the substantially undoped channel region 110 has a dopant concentration less than $5\times10^{17}$ dopant atoms per cm$^3$ adjacent or near the gate dielectric 140. In some embodiments, the substantially undoped channel layer 110 may have a dopant concentration that is specified to be approximately less than one tenth of the dopant concentration in the screen layer 120. In still other embodiments, depending on the transistor characteristics desired, the substantially undoped channel layer 110 may contain dopants so that the dopant concentration is elevated to above $5\times10^{17}$ dopant atoms per cm$^3$ adjacent or near the gate dielectric 140. Preferably, the substantially undoped channel layer 110 remains substantially undoped by avoiding the use of halo or other channel implants. In one embodiment, the channel layer 110 is formed by a blanket (or selective) epitaxial deposition step that is performed after forming the screen layer 120.

The isolation structure 104 of FIGS. 1 and 2 can be formed through STI structures that are etched and filled with a dielectric material. In certain embodiments, STI structures are preferably formed after the blanket EPI deposition step, using a process that remains within a thermal budget that effectively avoids substantial change to the dopant profiles of the previously formed screen layer 120 and threshold voltage set layer.

In operation, when gate electrode 142 voltage is applied to the transistor 100 at a predetermined level, a depletion region formed in the substantially undoped channel layer 110 may extend to the screen layer 120. The screen layer 120, if fabricated according to specification, effectively pins the depletion region to define the depletion zone depth.

The threshold voltage (Vt) in conventional field effect transistors (FETs) can be set by directly implanting a "threshold voltage implant" into the channel, raising the threshold voltage to an acceptable level that reduces transistor off-state leakage while still allowing speedy transistor switching. Alternatively, the threshold voltage in conventional FETs can also be set by a technique variously known as "halo" implants, high angle implants, or pocket implants. Such implants create a localized graded dopant distribution near a transistor source and drain that extends a distance into the channel. Halo implants are often required by transistor designers who want to reduce unwanted source/drain leakage conduction or "punch through" current and other short channel effects, but have the added advantage of adjusting the threshold voltage. Unfortunately, halo implants introduce additional process steps, thereby increasing the manufacturing cost. Also, halo implants can introduce additional dopants in random unwanted locations in the channel. These additional dopants increase the variability of the threshold voltage between transistors and decrease mobility and channel transconductance due to the adverse effects of additional and unwanted dopant scattering centers in the channel. Eliminating or greatly reducing the halo implants is desirable for reducing manufacture time and making more reliable wafer processing. By contrast, the techniques for forming the transistor 100 use different threshold voltage setting techniques that do not rely on halo implants (i.e. haloless processing) or channel implants to set the threshold voltage to a desired range. By maintaining a substantially undoped channel near the gate, these transistors further allow for greater channel mobility for electron and hole carriers with reduced variation in threshold voltage from device to device.

As will also be appreciated, position, concentration, and thickness of the screen layer 120 are important factors in the design of the DDC transistor 100. In certain embodiments, the screen layer 120 is located above the bottom of the source and drain junctions 106 and below the LDD junctions 108. To dope the screen layer 120 so as to cause its peak dopant concentration to define the edge of the depletion width when the transistor is turned on, methods such as delta doping, conventional dopant implants, or in-situ doping is preferred, since the screen layer 120 should have a finite thickness to enable it to adequately screen the well while avoiding creating a path for excessive junction leakage. With such a screen layer 120, the transistor 100 can simultaneously have good threshold voltage matching, low junction leakage, good short channel effects, and still have an independently controllable body due to a strong body effect. In addition, multiple transistors having different threshold voltages can be easily implemented by customizing the position, thickness, and dopant concentration of the threshold voltage set layer and/or the screen layer 120 while at the same time achieving a reduction in the threshold voltage variation. In one embodiment, the screen layer 120 is positioned such that the top surface of the screen layer 120 is located approximately at a distance of Lg/1.5 to Lg/5 below the gate dielectric 140 (where Lg is the gate length). In one embodiment, the threshold voltage set layer has a dopant concentration that is approximately 1/10 of the screen layer 120 dopant concentration. In certain embodiments, the threshold voltage set layer is thin so that the combination of the threshold voltage set layer and the screen layer 120 is located approximately within a distance of Lg/1.5 to Lg/5 below the gate dielectric 140.

Modifying threshold voltage by use of a threshold voltage set layer positioned above the screen layer 120 and below the substantially undoped channel layer 110 is an alternative technique to conventional threshold voltage implants for adjusting threshold voltage. Care must be taken to prevent dopant migration into the substantially undoped channel layer 110, with the use of low temperature anneals and dopant anti-migration techniques being recommended for many applications. More information about the formation of the threshold voltage set layer is found in pending U.S. application Ser. No. 12/895,785, the entirety of which is hereby incorporated herein by reference.

Dopant migration resistant implants or layers of carbon, pre-amorphization implants, or the like, can be applied below, along with, or above the screen layer 120 to further limit dopant migration. In FIG. 1, the extent of carbon implants is generally indicated to extend through the screen layer 120 and may extend upward through either part of or all of the channel 110. Germanium pre-amorphization implants are generally indicated to extend from above the NMOS screen layer 120 downward past the APT suppression layer 122. For DDC devices that utilize a pre-amorphization layer and SPE anneal, the screening layer 120, the threshold voltage set layer, and the APT suppression layer 120 (the screen layer 120, threshold voltage set layer, and APT suppression layer 122 are also referred to as well implant layers) can all be affected by remaining germanium end of range (EOR) damage that can include dislocations, high interstitial injection, and other crystal defects to cause unwanted migration of boron or other dopant atoms through the damaged area.

Figure 3:
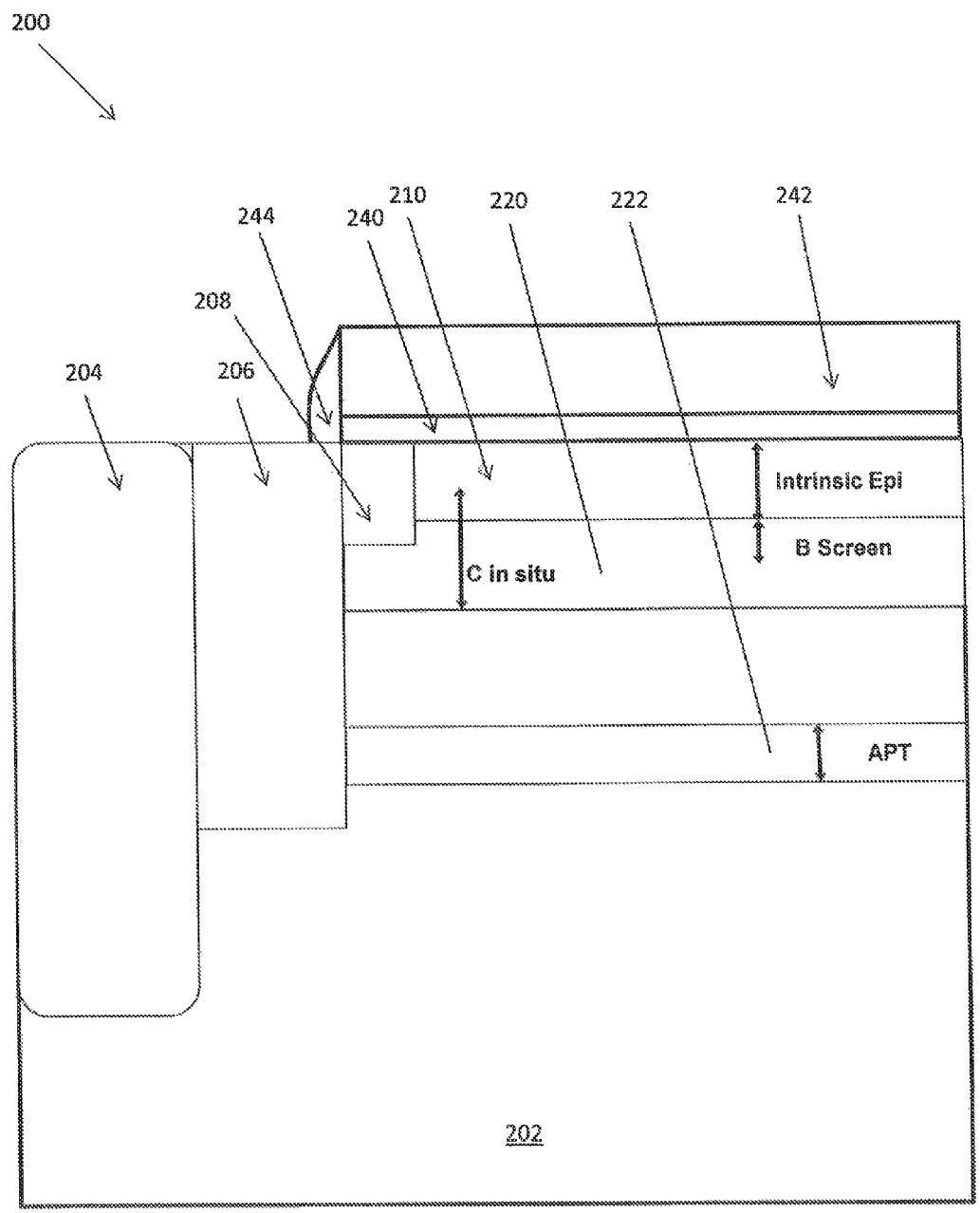
FIG. 3 illustrates an embodiment of an NMOS transistor having no incorporated germanium pre-amorphization implants, but with an in-situ carbon doped silicon substrate to limit boron screen diffusion.

Reducing unwanted damage effects while maintaining desired dopant profiles is possible with use of the following disclosed structures and processes. FIG. 3 generally illustrates a portion of a NMOS transistor 200 having a screen layer 220 and a substantially undoped channel layer 210 that are similar to corresponding layers of transistor 100 in FIG. 1 but formed without the use of Ge PAI. The transistor 200 instead utilizes in-situ carbon doped silicon substrate in which the well implant layers are formed in order to limit NMOS screen layer 220 diffusion. The transistor 200 includes an NMOS APT suppression layer 222, a NMOS screen layer 220 formed in the carbon doped silicon substrate and positioned above the NMOS APT suppression layer 222, and a substantially undoped channel layer 210. In one embodiment, carbon doped silicon is in-situ grown as an epitaxial layer on the substrate forming a carbon doped silicon substrate into which the NMOS screen layer 220 dopants are subsequently implanted so as to form the NMOS screen layer 220 within the carbon doped silicon substrate. The carbon dopants in the in-situ doped silicon substrate occupy substitutional sites, thereby reducing unwanted diffusion of NMOS screen layer 220 dopants and maintaining desired dopant profiles. As shown FIG. 3, some carbon dopants can diffuse into the substantially undoped channel layer 210 during subsequent process steps that form remaining elements of the transistor 200, e.g. during gate formation and/or source/drain 206 formation.

Figure 4:
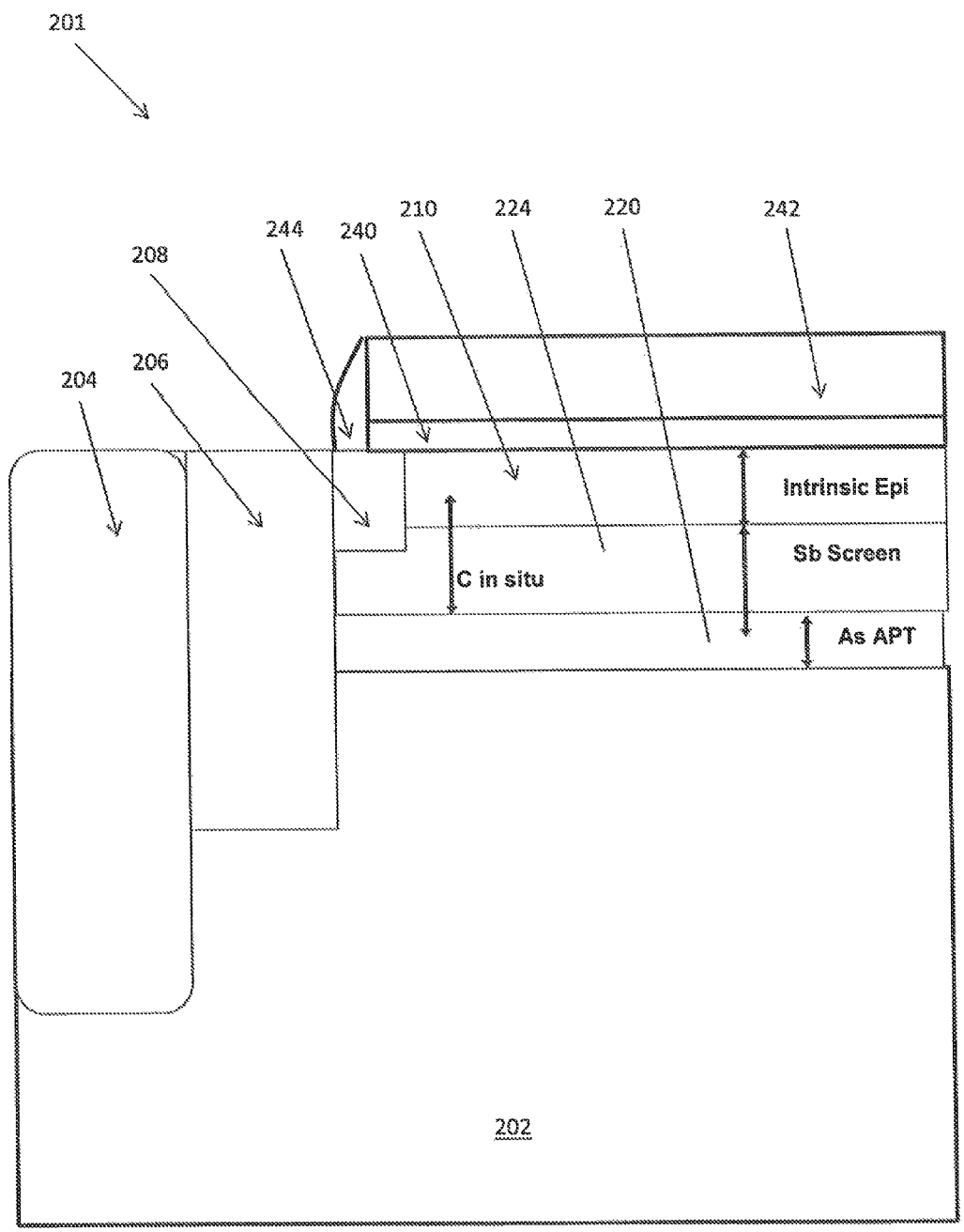
FIG. 4 illustrates an embodiment of a PMOS transistor having no incorporated germanium pre-amorphization implants, along with an in-situ carbon doped silicon substrate formable along with a structure in accordance with FIG. 4.

FIG. 4 generally illustrates a portion of the PMOS transistor 201 that can be formed on the same substrate as the NMOS transistor 200 depicted in FIG. 3. More specifically, this transistor 201 has added to its structure in-situ carbon doped silicon that is grown in the same process steps as for forming the carbon doped silicon substrate of FIG. 3. The transistor 201 includes a PMOS APT suppression layer 222, a PMOS screen layer 224 formed in the carbon doped silicon substrate and positioned above the PMOS APT suppression layer 222, and a substantially undoped channel layer 210. The transistor 201 utilizes the in-situ carbon doped silicon substrate to limit PMOS screen layer 220 diffusion. In one embodiment, the carbon doped silicon for the PMOS transistor 201 can be grown at the same time the carbon doped silicon for NMOS transistor 200 and PMOS screen layer 220 is formed, resulting in the carbon doped silicon substrate for the PMOS transistor 201. In one embodiment, the carbon doped silicon is in-situ grown as an epitaxial layer on the substrate 202 forming a carbon doped silicon substrate into which the PMOS screen layer 220 dopants are subsequently implanted so as to form the PMOS screen layer 220 within the carbon doped silicon substrate. The carbon dopants in the in-situ carbon doped silicon substrate occupy substitutional sites, thereby reducing unwanted diffusion of PMOS screen layer 220 dopants and maintaining desired dopant profiles. As shown in FIG. 4, some carbon dopants can diffuse into the substantially undoped channel layer 210 during subsequent process steps to form remaining elements of the transistor 201, e.g. gate formation or source/drain 206 formation.

The PMOS transistor 201 has carbon dopants in the PMOS screen layer 220 because the carbon doped silicon substrate is formed as a blanket epitaxial layer that is formed over both the NMOS and PMOS transistor regions 200 and 201 during the same process step. However, the carbon doping may be eliminated for the PMOS transistors 201 if the PMOS screen layer 220 is formed using dopants having a low diffusivity such that the diffusion of PMOS screen layer 220 dopant profile can be maintained without using carbon. Not using carbon in such embodiments can be advantageous because the carbon atoms can result in reduced mobility of the charge carriers and, therefore, affect the electrical characteristics of the PMOS transistor 201. Therefore, in alternative embodiments that use selective epitaxial layers to form the PMOS and NMOS screen layers 220, the PMOS transistors 201 can use a slow diffusing dopant species (such as As or Sb) to form the PMOS screen layer 220 and not have any carbon, while the NMOS transistors 200 can still use carbon to reduce the diffusion of NMOS screen layer 220 dopants.

Figure 5:
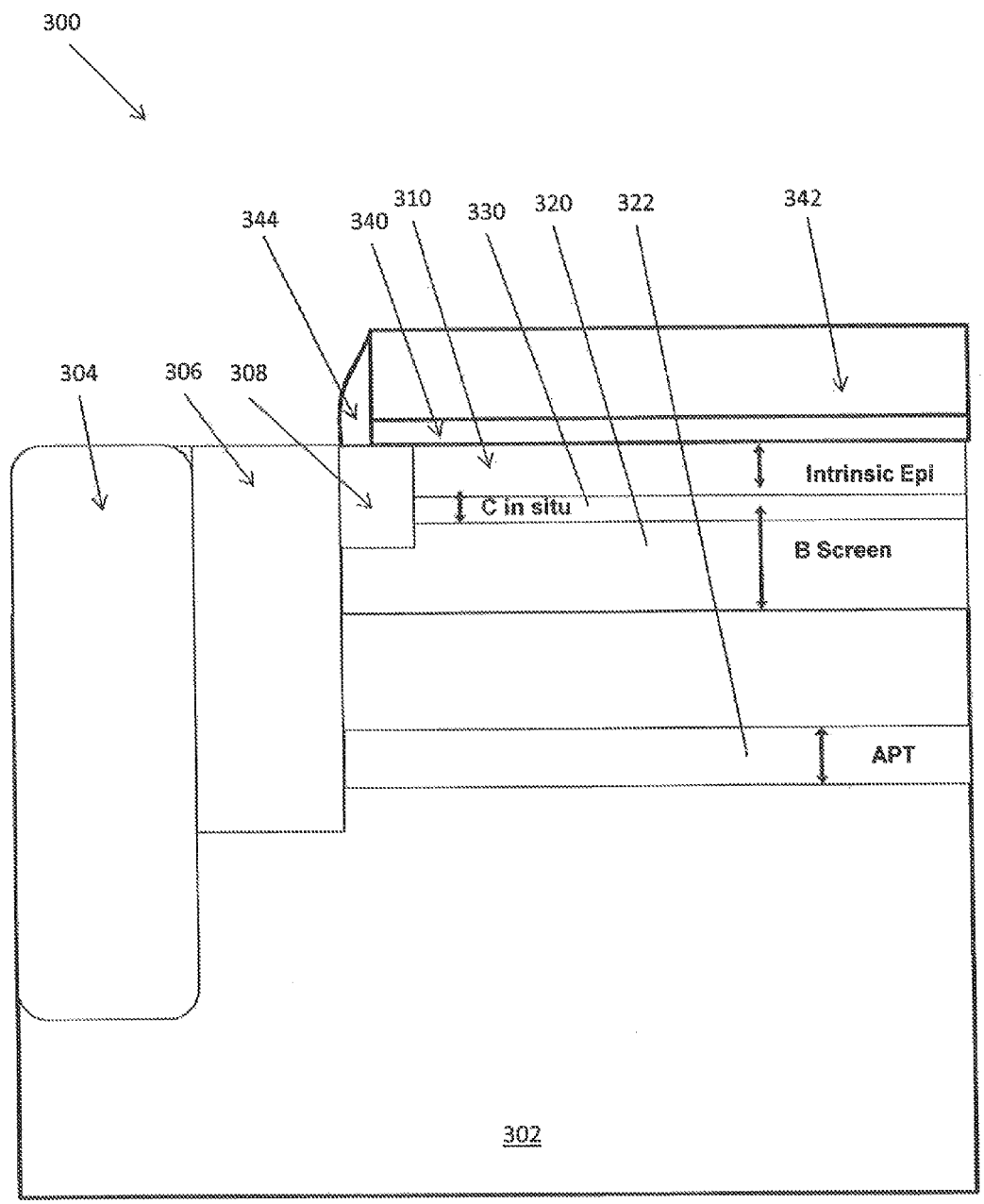
FIG. 5 illustrates an embodiment of an NMOS transistor having no incorporated germanium pre-amorphization implants, but with an in-situ carbon doped silicon epitaxial layer epitaxially grown above the screen.

FIG. 5 is an illustration of another variation of an NMOS transistor 300 having no incorporated germanium pre-amorphization implants, but with an in-situ epitaxial carbon doped silicon layer 330 positioned above the NMOS screen layer 320 to limit the diffusion of dopants from the screen layer 320. The transistor 300 also includes a NMOS APT suppression layer 322 and a NMOS screen layer 320 that are formed in the substrate 302 or in a doped well in the substrate 302. In one embodiment, the carbon doped silicon layer 330 is formed as an in-situ doped blanket epitaxial layer and is typically a thin layer that is 5-50 nm thick. The carbon dopants in the in-situ doped epitaxial layer 330 occupy substitutional sites, thereby reducing unwanted diffusion of NMOS screen layer 320 dopants and maintaining desired dopant profiles. Typically, the carbon doped silicon layer 330 reduces the diffusion of NMOS screen layer 320 dopants by protecting the NMOS screen layer 320 from interstitials generated above the NMOS screen layer 320, e.g., at the gate dielectric 340. As shown in FIG. 5, the substantially undoped channel layer 310 is formed above the carbon doped silicon layer 330. In one embodiment, the substantially undoped channel layer 310 is formed as a blanket epitaxial layer. In certain embodiments, the thickness of the carbon doped silicon layer 330 can range from as little as 5 nm up to the full thickness of the substantially undoped channel layer 310. In one embodiment, the thickness of the carbon doped silicon layer 330 is selected to be sufficient to trap interstitials generated from the gate dielectric 340.

Figure 6:
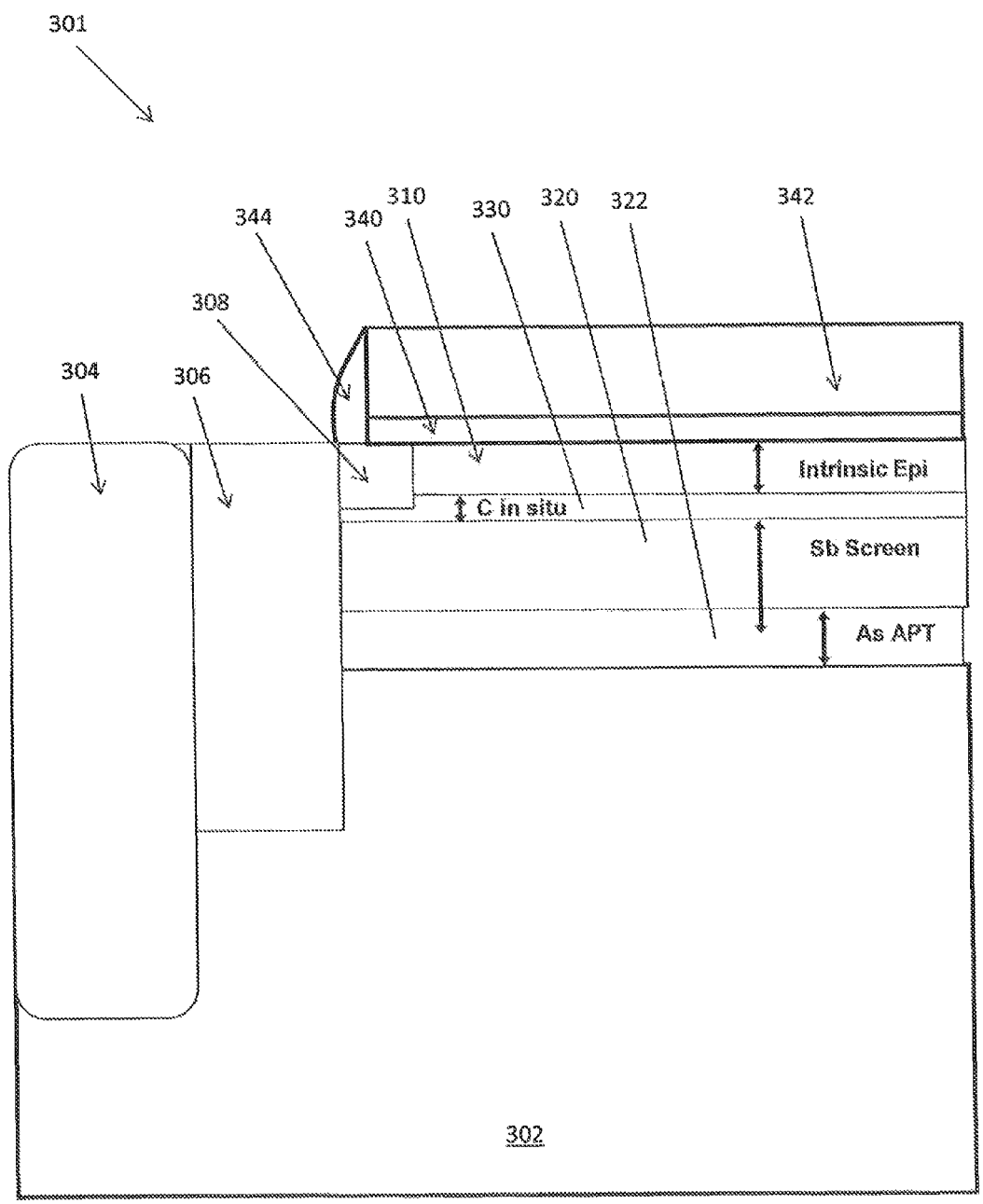
FIG. 6 illustrates an embodiment of a PMOS transistor having no incorporated germanium pre-amorphization implants, but with an in-situ carbon doped silicon epitaxial layer formable along with a structure in accordance with FIG. 5.

FIG. 6 generally illustrates a portion of the PMOS transistor 301 that can be formed on the same substrate as the NMOS transistor 300 depicted in FIG. 5. The transistor 301 includes a PMOS APT suppression layer 322, a PMOS screen layer 320 positioned above the PMOS APT suppression layer 322, a carbon doped silicon layer 330 is formed above the NMOS screen layer 320, and a substantially undoped channel layer 310 formed above the carbon doped silicon layer 330. The PMOS APT suppression layer 322, and the PMOS screen layer 320 are formed by implanting dopants in the substrate 302 or in a doped well in the substrate 302. The carbon doped silicon layer 330 can be formed as a blanket epitaxial layer that is formed over both the NMOS transistor 300 and the PMOS transistor 301 during the same process step. The carbon doped silicon layer 330 is formed above the NMOS and PMOS screen layers 320. The carbon dopants in the in-situ doped epitaxial layer 330 occupy substitutional sites, thereby reducing unwanted diffusion of PMOS screen layer 320 dopants and maintaining desired dopant profiles. Typically, the carbon doped silicon layer 330 reduces the diffusion of PMOS screen layer 320 dopants by protecting the PMOS screen layer 320 from interstitials generated above the PMOS screen layer 320, e.g., at the gate dielectric 340. As shown in FIG. 6, the substantially undoped channel layer 310 is formed above the carbon doped silicon layer 330. In one embodiment, the substantially undoped channel layer 310 can also be a blanket epitaxial layer that is formed over both the PMOS transistor 301 and the NMOS transistor 300 during the same process steps. In alternative embodiments, where low diffusivity dopant species are used to form the PMOS screen layer 320, the carbon doped silicon layer 330 may not be desired. Such alternative embodiments can use selective epitaxy from the carbon doped silicon layer 330 above the NMOS screen layer 320 without forming the carbon doped silicon layer 330 above the PMOS screen layer 320, resulting in a PMOS transistor 301 that does not have any carbon dopants.

Figure 7:
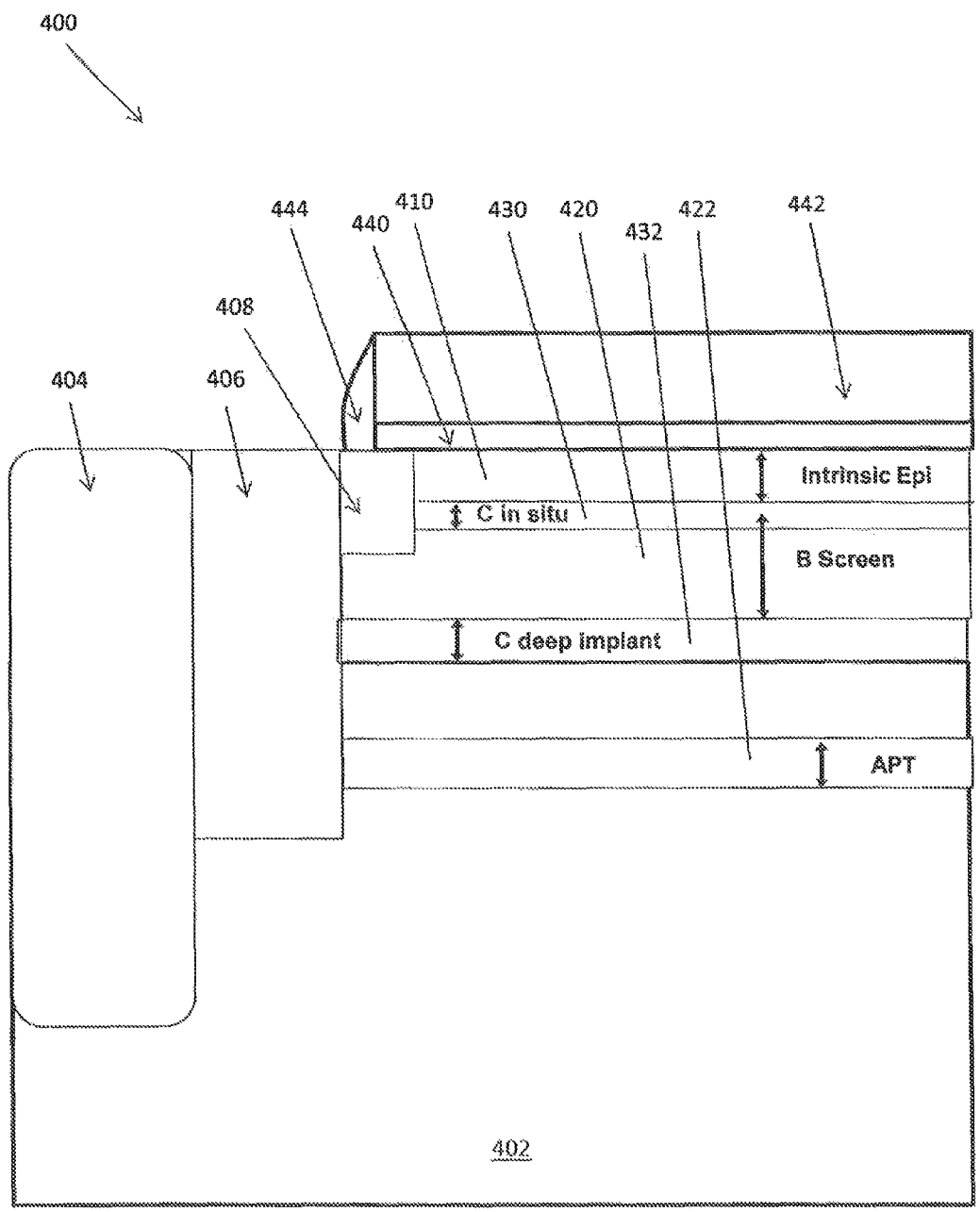
FIG. 7 illustrates an embodiment of an NMOS transistor having no incorporated germanium pre-amorphization implants, but with two separately formed carbon doped regions to limit boron screen layer diffusion.

FIG. 7 is an illustration of an NMOS transistor 400 having no incorporated germanium pre-amorphization implants, but with an in-situ epitaxial carbon doped silicon layer 430 positioned above the screen layer 420 and a deep carbon implant layer 432 positioned below the screen layer 420 to limit the diffusion of dopants from the screen layer 420. The transistor 400 can be formed by implanting a NMOS APT suppression layer 422 in the substrate 402 or in a doped well in the substrate 402. Subsequently, carbon can be implanted to form the deep carbon implant layer 432, which is followed by an implant step that forms the NMOS screen layer 420. Since the deep carbon implant layer 432 protects the NMOS screen layer 420 from interstitials generated below the screen layer 420, it is typically positioned close to the NMOS screen layer 420. However, it can also be positioned below the NMOS screen layer 420 (such as between the NMOS screen layer 420 and the NMOS APT suppression layer 422), below the NMOS APT suppression layer 420, or above the source of interstitials below the NMOS screen layer 420. Thus, one layer of carbon 430 is an in-situ doped silicon layer epitaxially grown above the screen layer 420 and the other layer of carbon 432 is a deep carbon implant layer positioned below the screen layer 420. The positioning of deep carbon implant layer 432 in relation to in-situ epitaxial carbon doped silicon layer 430 (i.e. the distance between these layers and depth within the substrate 302) may be determined based on a desired threshold voltage for the NMOS transistor 400. In alternative embodiments, fluorine can be implanted instead of carbon to form the deep implant layer 432. The use of fluorine instead of carbon can be advantageous because fluorine can be fully activated with a normal spike anneal, while carbon may only be partially activated.

Referring to FIG. 7, the carbon doped silicon layer 430 is formed above the NMOS screen layer 420 and a substantially undoped channel layer 410 is formed above the carbon doped silicon layer 430. Formation of a complimentary PMOS transistor, though not shown, may similarly be performed as PMOS transistors 101, 201, and 301 discussed above with the additional features as discussed in FIG. 7. In one embodiment, the substantially undoped channel layer 410 and/or the carbon doped silicon layer 430 is formed as a blanket epitaxial layer that is formed over both a PMOS transistor and NMOS transistors 400 formed on the same substrate 402 during the same process steps. Typically, the carbon doped silicon layer 430 protects the NMOS screen layer 420 from interstitials generated above the NMOS screen layer 420, e.g., at the gate dielectric 440, and the deep carbon implant layer 432 protects the NMOS screen layer 420 from interstitials generated below the deep carbon implant layer 432. In one embodiment, where the PMOS screen layer of the PMOS transistor (not shown) is formed using a slow diffusing dopant species, the deep carbon implant layer can be formed only for the NMOS transistor 400, and the PMOS transistor may not have a deep carbon implant layer positioned below the PMOS screen layer. In such embodiments, the carbon doped silicon layer 430 may not be desired for the PMOS transistor. Therefore, the carbon doped silicon layer 430 can be formed as a selective epitaxial layer that is formed only above the NMOS screen layer 420 and not above the PMOS screen layer, resulting in a PMOS transistor that does not have any carbon dopants. In various embodiments, only one carbon doped layer (i.e., either the deep carbon implant layer 432 or the carbon doped silicon layer 430) can be used to protect the NMOS screen layer 420 or both carbon doped layers can be used (as illustrated in FIG. 7).

Figure 8:
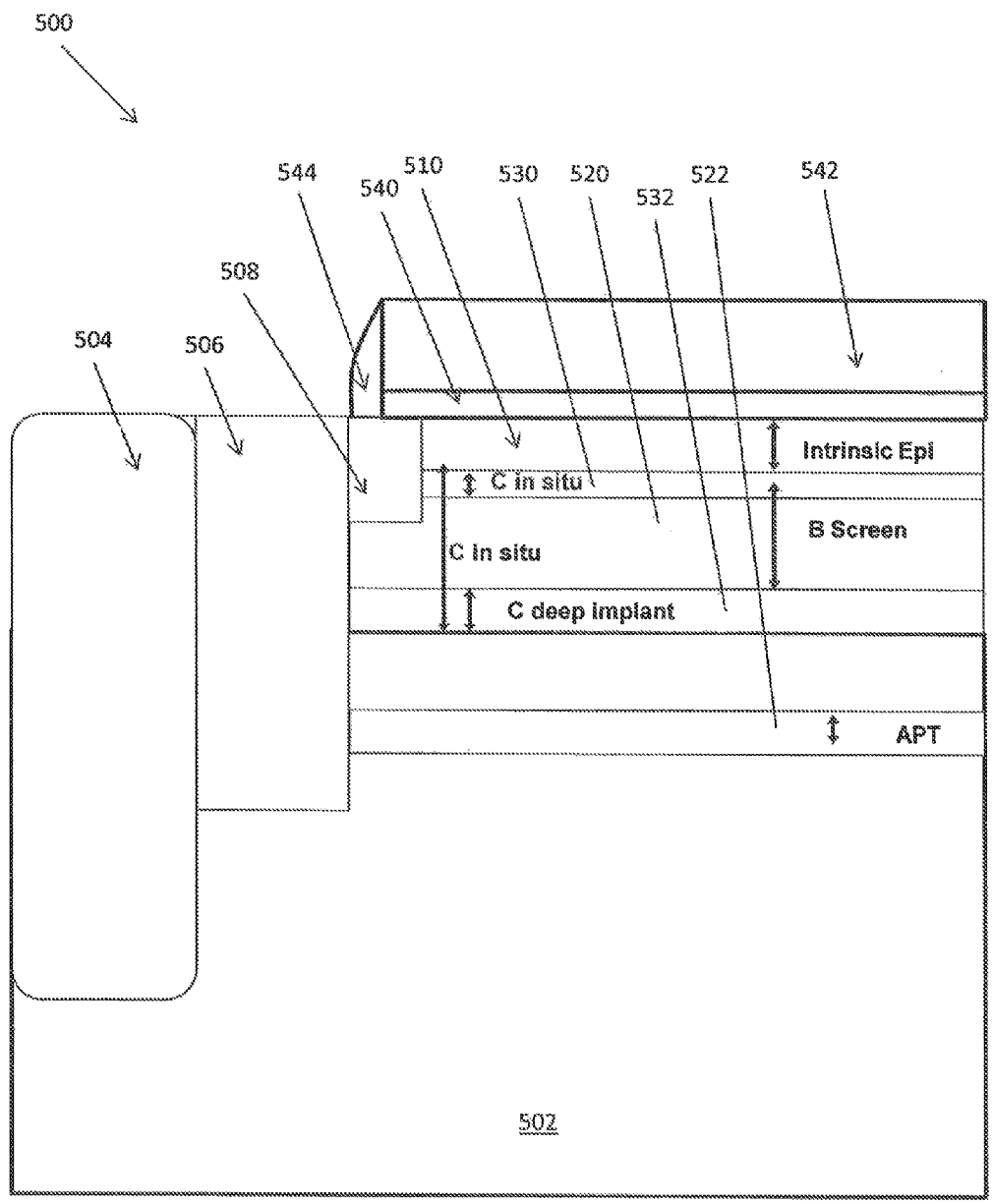
FIG. 8 illustrates an embodiment of an NMOS transistor having no incorporated germanium pre-amorphization implants, but with three separately formed carbon doped regions to limit boron screening layer diffusion.

FIG. 8 is an illustration of an NMOS transistor 500 having no incorporated germanium pre-amorphization implants, but with a deep in-situ epitaxial carbon doped silicon formed in the substrate 502 to extend throughout the screen layer 520, an in-situ epitaxial carbon doped silicon layer 530 formed between the screen layer 520 and the substantially undoped channel 510, and a deep carbon implant layer 532 positioned below the screen layer 520 to limit the diffusion of dopants from the screen layer 520. The transistor 500 includes a NMOS APT suppression layer 522 that is formed by implanting dopants in a substrate 502 or a doped well in the substrate 502.

After forming the NMOS APT suppression layer 522, carbon can be implanted to form the deep carbon implant layer 532. Thus, one use of carbon is in-situ carbon doped silicon epitaxially grown over the substrate 502 to create a carbon doped substrate region within which the device well implant layers can be formed. The second use of is a deep carbon implant layer 532 positioned below the screen layer 520. The third use of carbon is an in-situ carbon doped silicon layer 530 epitaxially grown above the screen layer 520 The positioning of deep carbon implant layer 532 in relation to in-situ epitaxial carbon doped silicon layer 530 (i.e. the distance between these layers and depth within the substrate 502) may be determined based on a desired threshold voltage for the NMOS transistor 500. In alternative embodiments, fluorine can be implanted instead of carbon to form the deep implant layer 532. In one embodiment, the deep in-situ carbon doped silicon is grown as an epitaxial layer on the substrate 502 forming a carbon doped silicon substrate into which the NMOS screen layer 520 dopants are subsequently implanted so as to form the NMOS screen layer 520 within the carbon doped silicon substrate. The carbon dopants in the carbon doped silicon substrate occupy substitutional sites, thereby reducing unwanted diffusion of NMOS screen layer 520 dopants and maintaining desired dopant profiles. The thin carbon doped silicon layer 530 is formed above the NMOS screen layer and a substantially undoped channel layer 510 is formed above the carbon doped silicon layer 530. In one embodiment, the substantially undoped channel layer 510 and/or the carbon doped silicon layer 530 can be formed as a blanket epitaxial layer that is formed over both a PMOS transistor (not shown) and NMOS transistor 500 formed on the same substrate 502 during the same process steps. In one embodiment, where the PMOS screen layer of the PMOS transistor is formed using a slow diffusing dopant species, the deep carbon implant layer can be formed only for the NMOS transistor 500, and the PMOS transistor may not have a deep carbon implant layer positioned below the PMOS screen layer. In such embodiments, the carbon doped silicon layer 530 and the carbon doped silicon substrate may not be desired for the PMOS transistor. Therefore, the carbon doped silicon layer 530 and the carbon doped silicon substrate can be formed as selective epitaxial layers that are formed only for the NMOS transistor 500 and not for the PMOS transistor, resulting in PMOS transistors that do not have any carbon dopants.

Figure 9:
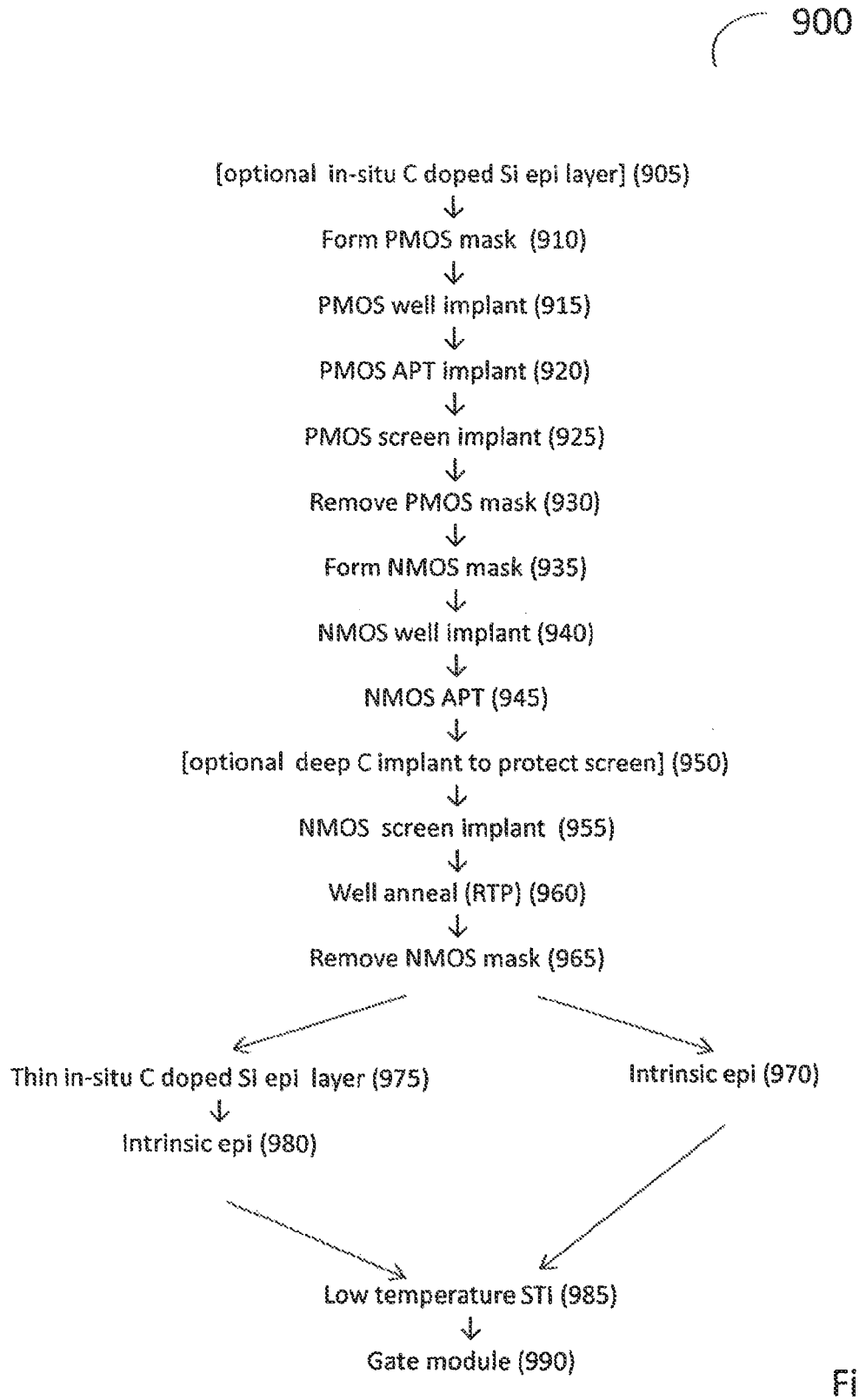
FIG. 9 illustrates process steps for transistor manufacture that can be used to produce embodiments in accordance with the present disclosure.

FIG. 9 illustrates several embodiments of a process 900 that can be used to produce structures of the present disclosure. As shown in step 905, carbon doped silicon can be in-situ grown as an epitaxial layer, forming a carbon doped silicon substrate area into which the DDC transistor can subsequently be fabricated. Embodiments of DDC transistors that are formed in a carbon doped substrate area have been described previously with reference to FIGS. 3, 4, and 8. In one embodiment, the in-situ carbon doped silicon can be grown on single wafers using chemical vapor deposition at temperatures in the range of 550° C.-800° C. and pressures in the range of 10-400 torr (T), at atmospheric pressure, or in a system pressurized to exceed atmospheric pressure, using a $H_2$ carrier gas in the range of 20-40 standard liters per minute (slm) with a silicon source such as $SiH_4$ or $Si_2H_6$ in the range of 50-100 standard cubic centimeter per minute (sccm) and a carbon source such as $CH_3SiH_3$ or $C_2H_4$ in the range of 10-50 sccm, where the mole fraction of the carbon source in $H_2$ can be in the range of 0.1% to 1%). In an alternative embodiment, the in-situ carbon doped silicon can be grown in a batch UHVCD furnace at 450-750° C. and 1-100 mT temperature and pressure, respectively, using an ambient such as He, H2, N2, or Ar. The silicon source can be $SiH_4$ or $Si_2H_6$ in the range of 1-50 sccm and the carbon source can be $CH_3SiH_3$ or $C_2H_4$ in the range of 1-10 sccm, where the mole fraction of the carbon source in $H_2$ can be in the range of 0.01% to 1%). In certain embodiments, the thickness of the in-situ carbon doped silicon can range between 20-100 nm. Typically the thickness of the in-situ carbon doped silicon is selected to be greater than the thickness of the PMOS screen layer to be formed, so that the PMOS screen layer is formed entirely within the in-situ carbon doped silicon. For example, if the PMOS screen layer thickness is 30 nm, the thickness of the carbon doped silicon can be selected to be 40 nm.

In step 910, a PMOS mask is photolithographically patterned on a wafer, which is then used in step 915 to form the PMOS well. In one embodiment, phosphorus (P) is implanted at 200-400 keV and at doses in the range of $1 \times 10^{13}$ to $5 \times 10^{13}$ atoms/cm$^2$ to form the PMOS well. In steps 920 and 925, respectively, the PMOS APT suppression layer and the PMOS screen layer are formed. The PMOS well implant and/or the PMOS APT suppression layer implant can be done either directly into the in-situ carbon doped silicon or it can be directed to form a doped region below the in-situ carbon doped silicon. However, the PMOS screen implant is done directly into the in-situ carbon doped silicon layer so that the PMOS screen layer is formed within this substrate region. In one embodiment, arsenic (As) is implanted at 50-200 keV at doses in the range of $5 \times 10^{12}$ to $5 \times 10^{13}$ atoms/cm$^2$ to form the PMOS APT suppression layer and antimony (Sb) is implanted at 10-50 keV at doses in the range of $5 \times 10^{12}$ to $5 \times 10^{13}$ atoms/cm$^2$ to form the PMOS screen layer. The PMOS mask is removed at step 930 and an NMOS mask is formed at step 935. In step 940, the NMOS mask is used to form the NMOS well. In one embodiment, boron (B) is implanted at approximately 100-250 keV, at doses in the range of $1 \times 10^{13}$ to $5 \times 10^{13}$ atoms/cm$^2$ to form the NMOS well. In step 945, the NMOS APT suppression layer is implanted in the NMOS well. In one embodiment additional B is implanted at 15-40 keV at doses in the range of $5 \times 10^{12}$ to $5 \times 10^{13}$ atoms/cm$^2$ to form the shallow NMOS APT suppression layer.

In step 950 carbon is optionally implanted to form a deep carbon implant layer that is positioned between the NMOS screen layer and the NMOS APT layer. Embodiments of DDC transistors having a deep carbon implant layer have been described previously with reference to FIGS. 7 and 8. In one embodiment, carbon can be implanted at 20-60 keV at doses in the range of $1 \times 10^{14}$ to $1 \times 10^{15}$ atoms/cm$^2$ to form the deep carbon implant layer. In step 955, the NMOS screen layer is formed, which is followed by a 900° C.-1250° C. RTP/laser well anneal in step 960 and removal of the NMOS mask in step 965. In one embodiment, B is implanted at 0.5 to 10 keV at doses in the range of $5 \times 10^{12}$ to $5 \times 10^{13}$ atoms/cm$^2$ to form the NMOS screen layer. Typically the implant conditions for the NMOS screen layer are selected such that the NMOS screen layer is formed within the carbon doped silicon substrate formed in step 905 (if present), and positioned above the deep carbon implant layer formed in step 950. Since the deep carbon implant layer protects the NMOS screen layer from interstitials generated below the screen layer, it is typically positioned either close to the NMOS screen layer or above the source of interstitials below the screen layer. In alternative embodiments, fluorine can be implanted instead of carbon to form the deep implant layer. The use of fluorine instead of carbon can be advantageous because fluorine can be fully activated with a normal spike anneal, while carbon may only be partially activated. In one embodiment, shown in step 970, a blanket epitaxial layer of substantially undoped silicon is grown, such that the substantially undoped silicon layer is formed over the screen layers of both the NMOS and PMOS transistors. In certain other embodiments, shown in steps 975 and 980, respectively, an intermediate blanket epitaxial carbon doped silicon layer can be grown followed by a blanket epitaxial layer of substantially undoped silicon. Typically thin (about 5-10 nanometers or so), the carbon doped silicon layer formed at step 975 can act to reduce diffusion of dopants from the screen layer into the substantially undoped epitaxial layer and it can also consume unwanted silicon interstitials generated above the screen layer and to further reduce boron diffusion in the device structure. In one embodiment, the blanket epitaxial layer grown in step 980 can have a thickness that is approximately in the range of 5-40 nanometers. Embodiments of DDC transistors having an in-situ epitaxial carbon doped silicon layer positioned above the screen layer have been described previously with reference to FIGS. 5-8.

Various embodiments of the process 900 can include some but not all of the process steps for forming one or more of the carbon doped silicon layers described above, i.e. steps 905, 950, and 975. In one such embodiment, step 905 is performed so that the DDC transistors are formed in a silicon substrate with carbon dopants, while steps 950 and 975 are performed to form the deep carbon implant layer below the screen layer and the thin in-situ carbon doped silicon layer above the screen layer, respectively. In alternative embodiments, only one of the steps 905, 950, and 975 are performed such that only one carbon doping is used to limit the diffusion of screen layer dopants. In other embodiments, all three of these steps are performed, such that three carbon dopings are used to limit the diffusion of screen layer dopants.

Figure 10:
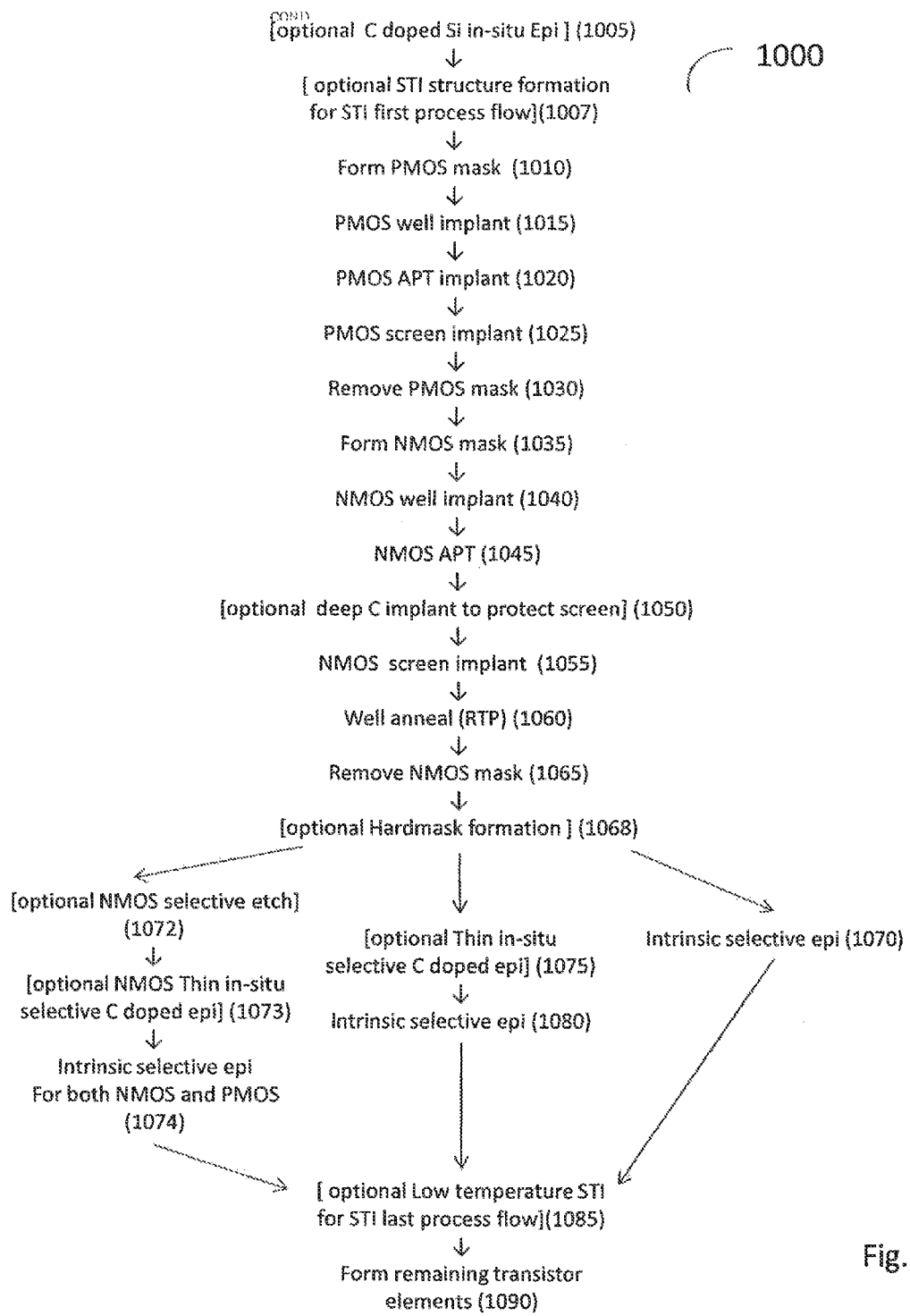
FIG. 10 illustrates process steps for transistor manufacture for several alternative process embodiments that use selective epitaxial layers.

FIG. 10 illustrates several embodiments of a process 1000 where the STI structures are formed before forming the DDC transistor elements. The process 1000 can use selective epitaxy in place of the blanket epitaxy steps described above with reference to the process 900 of FIG. 9 and can, therefore, eliminate additional steps for removing the unwanted silicon growth that would otherwise be formed over exposed dielectric structures, e.g. polysilicon that would be formed over STI elements if blanket epitaxy processing was utilized after STI formation. In one embodiment of the process 1000, as shown in step 1005, carbon doped silicon is in-situ grown as a blanket epitaxial layer, forming a carbon doped silicon substrate into which the DDC transistors can subsequently be fabricated. In an alternative embodiment, the substrate level carbon doped silicon growth step can be omitted and the DDC transistors can be formed in the silicon substrate or in a well in the silicon substrate. In one embodiment, the process conditions for forming the carbon doped silicon substrate in step 1005 are similar to the process conditions described above with reference to step 905 of FIG. 9.

In step 1007, the STI structures are optionally formed for an embodiment using an STI first process flow, thereby defining the areas where the NMOS and PMOS DDC transistors are to be formed. In an alternative embodiment using an STI last process flow, step 1007 can be omitted and STI structures are not formed at this stage of the process. In step 1010, a PMOS mask is lithographically patterned on the wafer, which is then used in step 1015 to form the PMOS well. In one embodiment, phosphorus (P) is implanted at 200-400 keV, at doses in the range of $1 \times 10^{13}$ to $5 \times 10^{13}$ atoms/cm$^2$ to form the PMOS well. In steps 1020 and 1025, respectively, the PMOS APT suppression layer and the PMOS screen layer are formed. In one embodiment, arsenic (As) is implanted at 50-200 keV at doses in the range of $5 \times 10^{12}$ to $5 \times 10^{13}$ atoms/cm$^2$ to form the PMOS APT suppression layer and antimony (Sb) is implanted at 10-50 keV at doses in the range of $5 \times 10^{12}$ to $5 \times 10^{13}$ atoms/cm$^2$ to form the PMOS screen layer. The PMOS mask is removed at step 1030 and an NMOS mask is formed at step 1035. In step 1040, the NMOS mask is used to form the NMOS well. In one embodiment, boron (B) is implanted at approximately 100-250 keV, at doses in the range of $1 \times 10^{13}$ to $5 \times 10^{13}$ atoms/cm$^2$ to form the NMOS well. In step 1045, the NMOS APT suppression layer is implanted in the NMOS well. In one embodiment, additional B is implanted at 15-40 keV at doses in the range of $5 \times 10^{12}$ to $5 \times 10^{13}$ atoms/cm$^2$ to form the shallow NMOS APT suppression layer.

In step 1050, an optional deep carbon implant can be performed to implant carbon above the APT suppression layer, followed by step 1055 that forms the NMOS screen layer above the carbon implant region. The deep carbon implant layer formed in step 1050 can limit the diffusion of NMOS screen layer dopants by trapping interstitials generated below the screen layer. The deep carbon implant layer may be used in addition to or in lieu of the carbon doped silicon substrate formed in step 1005. Typically, either the deep carbon implant layer or the carbon doped silicon substrate is used in a particular embodiment, with the deep carbon implant layer being used when the DDC transistors are formed in a silicon substrate instead of the carbon doped silicon substrate. Thus, the step 1050 for forming the deep carbon implant layer can be omitted in certain embodiments of the process 1000. Step 1050 can result in a deep carbon implant that is positioned between the APT layer and the screen layer for the NMOS transistor, such that the deep carbon implant can limit the diffusion of NMOS screen layer dopants (such as boron). In one embodiment, carbon is implanted at 20-60 keV at concentrations in the range of $1 \times 10^{14}$ to $1 \times 10^{15}$ to form the deep carbon implant layer. In one embodiment, B is implanted at 0.5 to 10 keV at concentrations in the range of $5 \times 10^{12}$ to $5 \times 10^{13}$ to form the NMOS screen layer. Typically, the implant conditions for the NMOS screen layer are selected such that the NMOS screen layer is formed within the carbon doped silicon substrate formed in step 1005 and positioned above the deep carbon implant layer formed in step 1050. Since the deep carbon implant layer protects the NMOS screen layer from interstitials generated below the screen layer, it is typically positioned either close to the NMOS screen layer or above the source of interstitials below the screen layer (e.g., an area where the lattice structure may be damaged). In alternative embodiments, fluorine can be implanted instead of carbon to form the deep implant layer. The use of fluorine instead of carbon can be advantageous because fluorine can be fully activated with a normal spike anneal, while carbon may only be partially activated. In step 1060, a 900° C.-1250° C. RTP/laser well anneal is performed.

In step 1065, the NMOS mask is removed and, in step 1068, an optional hardmask may be formed. The hardmask formed in step 1068 can be used to define the regions of the NMOS and PMOS transistors such that the STI islands are masked off in process embodiments that use an STI first process flow so that subsequent steps that form selective epitaxial layers for the NMOS and PMOS transistors do not form polysilicon over the STI islands. Moreover, the hardmask of step 1068 can be used to define transistors having a predetermined threshold voltage such that the subsequent steps that form epitaxial layers for the transistors can form selective epitaxial layers of different thicknesses for transistors having different threshold voltages. For example, epitaxial layers having different thicknesses can be formed for LVt transistors having a low threshold voltage and HVt transistors having a high threshold voltage, and different hardmasks can be formed to define the LVt and HVt transistor areas. In an alternative embodiment, different hardmasks can be formed to define the NMOS and PMOS transistor areas, permitting the use of different epitaxial layers for the NMOS and PMOS transistors. For example, a NMOS hardmask can be used to form carbon doped silicon epitaxial layers for the NMOS transistors and a PMOS hardmask can be used to form a substantially undoped epitaxial layer for the PMOS transistor so the PMOS transistors have no carbon dopants.

In one embodiment of the process 1000, shown in step 1070, a selective epitaxial layer of substantially undoped silicon is grown over the regions where the NMOS and PMOS transistors are to be formed. In an alternative embodiment, shown in steps 1075 and 1080 respectively, an intermediate selective epitaxial carbon doped silicon layer can be grown followed by a selective epitaxial layer of substantially undoped silicon. Typically thin (about 5-10 nanometers or so), the carbon doped silicon epitaxial layer formed at step 1075 can act to reduce diffusion of dopants from the screen layer into the substantially undoped epitaxial layer and it can also consume unwanted silicon interstitials to further reduce boron diffusion in the device structure. In one embodiment, the selective epitaxial layers grown in steps 1070 and 1074 can have a thickness that is approximately in the range of 5-40 nanometers. In certain embodiments, a hardmask can be formed in step 1068 to support the subsequent selective epitaxial deposition steps. For example, a hardmask defining the PMOS transistor regions can be used to perform step 1070 for the PMOS transistors and a different hardmask defining the NMOS transistor regions can be used to perform steps 1075 and 1080 for the NMOS transistor regions.

In one embodiment of the process 1000, the carbon implant layer and the carbon doped silicon substrate is formed only for the NMOS transistors while PMOS transistors are kept free of carbon. Such an embodiment can be advantageously used if low diffusivity dopant species are used to form the PMOS screen layer such that the dopant profile of the PMOS screen layer can be maintained without using carbon. Eliminating carbon in the PMOS transistor can be beneficial because the presence of carbon dopants can reduce the charge carrier mobility and may have an effect on transistor electrical characteristics. In order to accommodate this, the optional step 1005 is omitted such that the corresponding carbon doped silicon substrate is not formed. A selective silicon etch for the NMOS transistor regions is performed (step 1072) prior to forming the thin in-situ carbon doped silicon selective epitaxial layer (step 1073) for the NMOS transistors. The purpose of the selective etch for the NMOS transistors is to recess the silicon region of the NMOS transistors such that, after deposition of the carbon doped silicon substrate in step 1005, the NMOS transistor regions can have substantially the same step height as the PMOS transistor regions. Subsequently, a substantially undoped silicon epitaxial layer is grown as selective epitaxial layer in step 1074 such that a selective epitaxial layer is formed over the screen layers of both the NMOS and PMOS transistors.

In step 1085, a low temperature STI process step is performed to form STI structures for a process embodiment using an STI last process flow. In step 1090, remaining elements of the NMOS and PMOS transistors are formed, such as gate structures, source/drain implants, etc.

Figure 11:
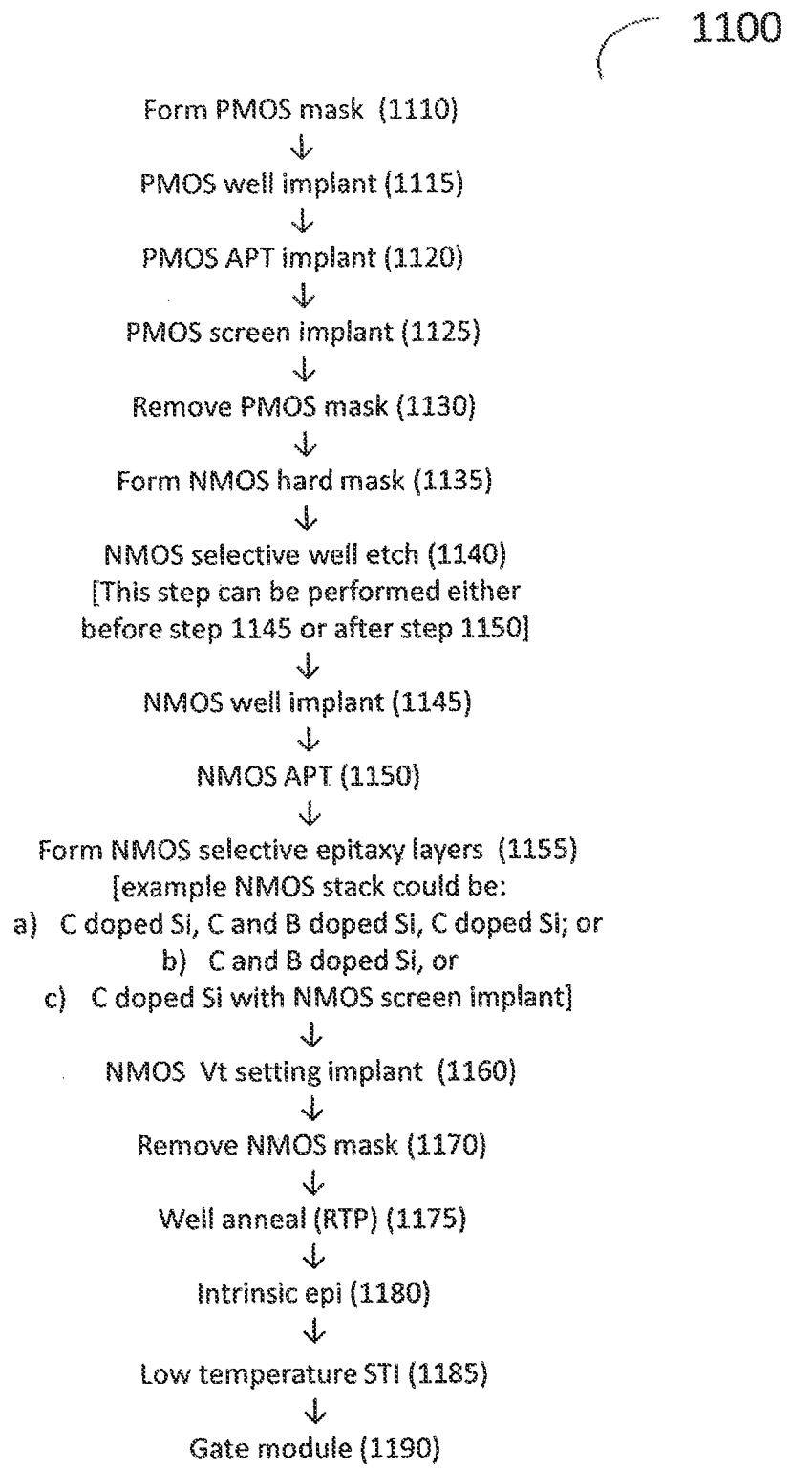
FIG. 11 illustrates process steps for transistor manufacture that can be used to limit the carbon species to the NMOS transistors only.

FIG. 11 illustrates a process 1100, where STI is processed after the screen and channel layers of the DDC transistors have been formed. The process flow 1100 utilizes additional steps to allow the carbon species to be limited to the NMOS device. In step 1110, a PMOS mask is lithographically patterned on a wafer, which is then used in step 1115 to form a PMOS well. In one embodiment, phosphorous is implanted at 200-400 keV to form the PMOS well. The PMOS APT suppression layer and the PMOS screen layer are formed in steps 1120 and 1125, respectively. In one embodiment, arsenic (As) can be implanted at 50-200 keV to form the PMOS APT suppression layer and antimony (Sb) can be implanted at 10-50 keV to form the PMOS screen layer. In steps 1130 and 1135, respectively, the PMOS mask is removed and an NMOS hard mask is formed.

Referring to FIG. 11, in step 1140, a selective silicon etch is performed in regions where the NMOS transistors are to be formed. The purpose of the selective silicon etch is to recess the silicon region of the NMOS transistors such that, after subsequent deposition of selective epitaxial layers for the NMOS transistors, the NMOS transistors regions can have substantially similar height as the PMOS transistor regions. In one embodiment, the selective silicon etch step 1140 is performed before the NMOS well implant and the NMOS screen implant in steps 1145 and 1150, respectively. In an alternative embodiment, the selective silicon etch step 1140 is performed after step 1145 and 1150. In one embodiment, Boron (B) is implanted at 100-250 keV to form the NMOS well and additional B is implanted at 15-40 keV to form a shallow NMOS APT suppression layer. If the depth of the selective silicon etchback is small compared to the depth of the NMOS well and NMOS APT suppression layers, then the NMOS well and NMOS APT suppression layer implant conditions are similar for the process embodiment that performs the NMOS selective well etch before step 1145, as compared to the embodiment that performs the NMOS selective well etch after step 1150. For example, similar implant conditions for the two embodiments are performed if the depth of the selective well etch is about 30 nm. Alternatively, the process embodiment that performs the NMOS selective well etch before step 1145 can use a lower implant energy for the NMOS well and NMOS APT suppression implants, as compared to the embodiment that performs the NMOS selective well etch after step 1150. In step 1155, NMOS selective epitaxial steps are performed to form the layers for the NMOS transistors. In accordance with various embodiments, these epitaxial steps can form an NMOS transistor stack that includes (a) a first selective epitaxial layer of carbon doped silicon, followed by a second selective epitaxial layer of silicon doped with carbon and NMOS screen layer dopants (such as boron), followed by a third selective epitaxial layer of thin carbon doped silicon that is formed above the second layer; or (b) a selective epitaxial layer of silicon doped with carbon and NMOS screen layer dopants to form a doped substrate layer;

or (c) a selective epitaxial layer of carbon doped silicon to form a carbon doped substrate in which NMOS screen layer dopants are subsequently implanted.

In step 1160, a NMOS transistor threshold implant can be optionally performed, if the NMOS transistors have a threshold set region. In step 1170, the NMOS mask is removed, and in step 1175 various thermal processing steps can be performed, including at step 1175 a 500° C.-800° C. SPE or a 900° C.-1250° C. RTP well anneal. In step 1180, a blanket epitaxial layer of substantially undoped silicon is formed such that the epitaxial layer is formed over the screen layers of both the NMOS and PMOS transistors. In one embodiment, the blanket epitaxial layer can have a thickness that is approximately in the range of 5-40 nanometers. After formation of the DDC transistor elements (such as the well implant layers and the substantially undoped channel layer described above), a low temperature STI formation is performed at step 1185 followed by gate formation at step 1190. Remaining transistor process modules are performed to complete the formation of the DDC transistor.

Transistors created according to the foregoing embodiments, structures, and processes can have a reduced threshold voltage mismatch arising from diffusion mediated dopant variations as compared to conventional MOS analog or digital transistors. This is particularly important for transistor circuits that rely on closely matched transistors for optimal operation, including differential matching circuits, analog amplifying circuits, and many digital circuits in widespread use such as SRAM cells. Variation can be even further reduced by adoption of structures such as a screen layer, an undoped channel, or a Vt set layer as described herein to further effectively increase headroom which the devices have to operate. This allows high-bandwidth electronic devices with improved sensitivity and performance, but still having reduced power consumption.

The present disclosure discusses building the screen and channel of advanced transistors such as a deeply depleted channel (DDC) type transistor. However, the methods and techniques described above can also be used by one skilled in the art to improve the securement of dopant profiles in other transistor types or transistor features such as shallow lightly doped drains (LDD) and S/D regions in advanced transistors.

Although the present disclosure has been described in detail with reference to a particular embodiment, it should be understood that various other changes, substitutions, and alterations may be made herein without departing from the spirit and scope of the appended claims. Numerous other changes, substitutions, variations, alterations, and modifications may be ascertained by those skilled in the art and it is intended that the present disclosure encompass all such changes, substitutions, variations, alterations, and modifications.

What is claimed is:

1. A method for forming an NMOS field effect transistor (FET) in a doped well of a substrate, the NMOS FET having a source and a drain, comprising:
   forming an epitaxial carbon-containing silicon layer in the doped well;
   implanting dopants to form an NMOS anti-punchthrough layer positioned below the carbon-containing silicon layer;
   implanting dopants in the epitaxial carbon-containing silicon layer to form an NMOS screen layer, the NMOS screen layer being positioned laterally between eventual positions of the source and the drain;
   annealing the substrate;
   following implanting of all dopants, depositing a substantially undoped epitaxial layer on the epitaxial carbon-containing silicon layer; and
   forming a plurality of isolation structures to define transistor regions.

2. The method of claim 1, wherein the epitaxial carbon-containing silicon layer is operable to substantially limit diffusion of the NMOS screen layer dopants without using pre-amorphization implants.

3. The method of claim 1, further comprising:
   implanting a diffusion-inhibiting material positioned between the NMOS screen layer and the anti-punch-through layer.

4. The method of claim 3, wherein the diffusion-inhibiting material is selected from the group consisting of carbon and fluorine.

5. The method of claim 1, further comprising:
   implanting a diffusion-inhibiting material to be positioned below both the NMOS screen layer and the anti-punch-through layer.

6. The method of claim 5, wherein the diffusion-inhibiting material is selected from the group consisting of carbon and fluorine.

7. The method of claim 1, wherein depositing a substantially undoped epitaxial layer includes depositing a blanket epitaxial silicon layer simultaneously over multiple transistor regions.

8. The method of claim 1, wherein forming the plurality of isolation structures occurs after depositing the substantially undoped epitaxial layer.

9. The method of claim 1, wherein forming the plurality of isolation structures occurs before forming the substantially undoped epitaxial layer.

10. A method for forming an NMOS FET in a doped well of a substrate, comprising:
    implanting dopants to form an NMOS anti-punchthrough layer;
    implanting dopants to form an NMOS screen layer;
    forming a carbon-containing region above the NMOS screen layer;
    forming a diffusion-inhibiting region below the NMOS screen layer using a diffusion-inhibiting material implant, wherein the carbon-containing region and the diffusion-inhibiting region are operable to substantially limit diffusion of the NMOS screen layer dopants;
    annealing using a low thermal budget anneal;
    depositing a substantially undoped epitaxial silicon layer on the substrate; and
    forming a plurality of isolation structures to define a plurality of transistor regions.

11. The method of claim 10 wherein the carbon-containing region is formed by in situ epitaxial deposition.

12. The method of claim 10, wherein forming a diffusion-inhibiting region below the NMOS screen layer includes forming the diffusion-inhibiting region below the anti-punch-through layer.

13. The method of claim 10, wherein the diffusion-inhibiting material implant is selected from the group consisting of carbon and fluorine.

14. The method of claim 10, wherein the dopants to form an NMOS screen layer include boron.

15. A method for forming an integrated circuit in a substrate, the substrate having a top surface, the integrated circuit based upon a plurality of transistor devices each having a defined threshold voltage, the method comprising:

forming a PMOS field effect transistor (FET) in a first doped well of the substrate, the PMOS FET having a source and a drain, wherein forming the PMOS FET includes:
  implanting dopants in the first doped well to form a PMOS anti-punchthrough layer; and
  implanting dopants in the first doped well to form a PMOS screen layer above the PMOS anti-punchthrough layer, the PMOS screen layer being positioned laterally between eventual positions of the source and the drain;
forming an NMOS field effect transistor (FET) in a second doped well of the substrate, the NMOS FET having a source and a drain, wherein forming the NMOS FET includes:
  implanting dopants in the first doped well to form an NMOS anti-punchthrough layer;
  forming an epitaxial carbon-containing silicon layer positioned above the NMOS anti-punchthrough layer, the epitaxial carbon-containing silicon layer being formed as a selective epitaxial layer; and
  implanting dopants in the epitaxial carbon-containing silicon layer to form an NMOS screen layer, the NMOS screen layer being positioned laterally between eventual positions of the source and the drain; and
annealing using a low thermal budget anneal;
forming one or more epitaxial silicon layers over the PMOS screen layer and the NMOS screen layer; and
forming a plurality of shallow trench isolation structures to define a plurality of transistor regions.

16. The method of claim 15, wherein forming the one or more epitaxial silicon layers includes using a blanket epitaxial deposition.

17. The method of claim 15, wherein the plurality of shallow trench isolation structures are formed before forming the one or more epitaxial silicon layers.

18. The method of claim 15, wherein the plurality of shallow trench isolation structures are formed after forming the one or more epitaxial silicon layers.

19. The method of claim 15, wherein the plurality of epitaxial silicon layers have differing thicknesses depending on targeted threshold voltages.

20. The method of claim 15, further comprising:
  forming a diffusion-inhibiting region below the NMOS screen layer using a diffusion-inhibiting material implant, wherein the epitaxial carbon-containing region and the diffusion-inhibiting region are operable to substantially limit diffusion of the NMOS screen layer dopants.

* * * * *